(12) United States Patent
Tang et al.

(10) Patent No.: US 12,362,717 B2
(45) Date of Patent: Jul. 15, 2025

(54) SECOND-ORDER EQUALIZER FOR HIGH-SPEED DATA LINES

(71) Applicant: QUALCOMM Incorporated, San Diego, CA (US)

(72) Inventors: Dongyang Tang, San Diego, CA (US); Ramkumar Sivakumar, San Diego, CA (US); Khaled Mahmoud Abdelfattah Aly, Irvine, CA (US); Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 173 days.

(21) Appl. No.: 18/055,996

(22) Filed: Nov. 16, 2022

(65) Prior Publication Data

US 2024/0162874 A1    May 16, 2024

(51) Int. Cl.
| | | |
|---|---|---|
| *H03G 5/16* | (2006.01) | |
| *G06F 3/16* | (2006.01) | |
| *H03F 3/183* | (2006.01) | |
| *H04R 3/00* | (2006.01) | |
| *H04S 1/00* | (2006.01) | |

(52) U.S. Cl.
CPC ............. *H03G 5/165* (2013.01); *G06F 3/162* (2013.01); *H03F 3/183* (2013.01); *H04R 3/00* (2013.01); *H04S 1/00* (2013.01); *H03F 2200/03* (2013.01); *H04R 2420/07* (2013.01); *H04R 2420/09* (2013.01)

(58) Field of Classification Search
CPC ............. G06F 13/4068; G06F 13/4282; G06F 2213/0042; G06F 3/162; H03F 2200/03; H03F 3/183; H03F 3/187; H03G 5/005; H03G 5/165; H04R 2420/07; H04R 2420/09; H04R 3/00; H04S 1/00
USPC ........................................ 381/17–28; 700/94
See application file for complete search history.

(56) References Cited

U.S. PATENT DOCUMENTS

| | | |
|---|---|---|
| 6,937,054 B2 | 8/2005 | Hsu et al. |
| 7,183,832 B1 | 2/2007 | Voo |

(Continued)

FOREIGN PATENT DOCUMENTS

| | | |
|---|---|---|
| CN | 103684279 A | 3/2014 |
| EP | 2773041 A1 | 9/2014 |

(Continued)

OTHER PUBLICATIONS

Chen J., et al., "Electrical Backplane Equalization Using Programmable Analog Zeros and Folded Active Inductors," IEEE Transactions on Microwave Theory and Techniques, Jul. 2007, vol. 55, No. 7, pp. 1459-1466.

(Continued)

*Primary Examiner* — Lun-See Lao
(74) *Attorney, Agent, or Firm* — Haynes and Boone, LLP

(57) ABSTRACT

A transmission line includes an equalization circuit. The equalization circuit is a second-order equalization circuit having a first loop at a gain element and a second loop at the gain element. The first loop may include a first compensation capacitor, and the second loop may include a second compensation capacitor and a resistor. The second order equalization circuit may allow for improved performance with respect to gain as well as reduced power usage.

30 Claims, 7 Drawing Sheets

(56) References Cited

U.S. PATENT DOCUMENTS

| | | | |
|---|---|---|---|
| 7,368,981 | B2 | 5/2008 | Miyagi |
| 7,536,114 | B2 | 5/2009 | Gieseler et al. |
| 7,560,957 | B2 | 7/2009 | Chen et al. |
| 7,697,601 | B2 | 4/2010 | Mansuri et al. |
| 8,200,179 | B1 | 6/2012 | Mosinskis et al. |
| 8,928,362 | B2 | 1/2015 | Kimura et al. |
| 9,520,872 | B2 | 12/2016 | Pandita |
| 9,692,617 | B2 | 6/2017 | Chung et al. |
| 9,806,915 | B1* | 10/2017 | Elzeftawi ............. H03G 3/3036 |
| 10,002,101 | B2 | 6/2018 | Wu et al. |
| 10,187,080 | B1 | 1/2019 | Thasari et al. |
| 10,498,523 | B1 | 12/2019 | Wang et al. |
| 10,715,358 | B1* | 7/2020 | Zhang ............... H04L 25/03878 |
| 10,733,129 | B2 | 8/2020 | Tang et al. |
| 11,689,201 | B2* | 6/2023 | Dhanasekaran .... G06F 13/4282 710/316 |
| 2002/0017893 | A1* | 2/2002 | Duff, Jr. .................. H02H 7/16 320/100 |
| 2007/0096820 | A1 | 5/2007 | Koh et al. |
| 2007/0132501 | A1 | 6/2007 | Koch et al. |
| 2009/0029733 | A1 | 1/2009 | Schilling et al. |
| 2010/0105319 | A1* | 4/2010 | Yeung ................. H04L 25/0278 455/7 |
| 2011/0191814 | A1 | 8/2011 | Kobayashi |
| 2012/0056660 | A1 | 3/2012 | Yamada et al. |
| 2012/0188031 | A1 | 7/2012 | Wu et al. |
| 2012/0242377 | A1 | 9/2012 | Yeung et al. |
| 2013/0049806 | A1 | 2/2013 | Koyama |
| 2013/0142244 | A1* | 6/2013 | Tan ................... H04L 25/03159 375/232 |
| 2013/0187717 | A1 | 7/2013 | Murphy et al. |
| 2014/0015476 | A1 | 1/2014 | Kondo |
| 2014/0036982 | A1* | 2/2014 | Ali ........................... H04B 3/04 375/229 |
| 2014/0105432 | A1 | 4/2014 | Jing et al. |
| 2014/0247089 | A1 | 9/2014 | Van Praet et al. |
| 2014/0247720 | A1 | 9/2014 | Spehar et al. |
| 2014/0266379 | A1 | 9/2014 | Inoue et al. |
| 2015/0363350 | A1 | 12/2015 | Yeung et al. |
| 2016/0147704 | A1 | 5/2016 | Guillerm et al. |
| 2016/0378704 | A1 | 12/2016 | Adamson et al. |
| 2017/0244426 | A1 | 8/2017 | Ogata |
| 2019/0130923 | A1 | 5/2019 | Elliot |
| 2019/0253284 | A1* | 8/2019 | Jalali Far .......... H04L 25/03146 |
| 2020/0125519 | A1 | 4/2020 | Pan et al. |
| 2020/0228115 | A1* | 7/2020 | Hou ..................... H03K 17/162 |
| 2020/0257354 | A1 | 8/2020 | Mning et al. |
| 2020/0287334 | A1 | 9/2020 | Kulkarni et al. |
| 2020/0313638 | A1* | 10/2020 | Hong .................. H03F 3/45183 |
| 2021/0075650 | A1 | 3/2021 | Rane et al. |
| 2022/0140821 | A1 | 5/2022 | Delshadpour et al. |
| 2023/0024172 | A1 | 1/2023 | Dhanasekaran et al. |
| 2023/0291402 | A1* | 9/2023 | Dhanasekaran ...... G06F 13/385 |

FOREIGN PATENT DOCUMENTS

| | | |
|---|---|---|
| EP | 4044441 A1 | 8/2022 |
| JP | H05303436 A | 11/1993 |
| KR | 101817258 B1 | 1/2018 |
| WO | 9857422 A1 | 12/1998 |
| WO | 2012082189 A1 | 6/2012 |

OTHER PUBLICATIONS

International Search Report and Written Opinion—PCT/US2022/036845—ISA/EPO—Oct. 13, 2022.

Musah T., et al., "A 4-32 GB/s Bidirectional Link with 3-Tap FFE/6-Tap DFE and Collaborative CDR in 22 nm CMOS", IEEE Journal of Solid-State Circuits, IEEE Service Center, Piscataway, NJ, USA, XP011564892, Dec. 1, 2014, vol. 49, No. 12, pp. 3079-3090, ISSN: 0018-9200, DOI: 10.1109/JSSC.2014.2348556 [retrieved on Nov. 20, 2014].

Razavi B., "Design of Integrated Circuits for Optical Communications," 2nd ed. Chapter 5, Wiley, 2012, pp. 130-184.

Razavi B., "The Cross-Coupled Pair-Part III", A Circuit for All Seasons, IEEE Solid-State Circuits Magazine, vol. 7, No. 1, pp. 10-13, Winter 2015, DOI: 10.1109/MSSC.2014.2369332, Date of publication: Feb. 11, 2015.

Sackinger E., et al., "A 3-GHz, 32-dB CMOS Limiting Amplifier for Sonet OC-48 Receivers," ISSCC Dig. Tech. Papers, Feb. 2000, pp. 158-159.

Sonna P., et al., "Broadband Programmable Equalizer and Limiting Amplifier for an XFI Interface in 45nm CMOS", Proceedings of the Argentine School of Micro-Nanoelectronics, Technology and Applications, 2009, IEEE, Piscataway, NJ, USA, XP031930107, Oct. 1, 2009, pp. 77-80, ISBN: 978-1-4244-4835-7.

Wang H., et al., "A 21-GB/s 87-mW Transceiver with FFE/DFE/Analog Equalizer in 65-nm CMOS Technology," IEEE Journal of Solid-State Circuits, Apr. 2010, vol. 45, No. 4, pp. 909-920.

International Search Report and Written Opinion—PCT/US2023/036821—ISA/EPO—Mar. 7, 2024.

* cited by examiner

SECOND-ORDER EQUALIZER FOR HIGH-SPEED DATA LINES

TECHNICAL FIELD

This application relates to equalizer circuits, and more particularly to second-order equalizer circuits for use in high-speed data lines.

BACKGROUND

A wireless communication device is generally a small form factor device among other small form factor devices, such as tablet devices. Due to the small configuration of such devices, using the device space economically is of particular interests. In this regard, it may be desirable to convert an audio path (e.g., to a headset or speakers) on a wireless communication device from a 3.5-millimeter (mm) jack to a Universal Serial Bus (USB) version C (USB-C) port connector, as the USB-C port connector is more versatile (e.g., transmits audio, exchanges USB data, exchanges battery charger data, etc.).

Because of the additional functionality of providing audio over USB-C, the differential transmission data lines DP/DN associated with the host USB-C circuit are loaded with many components, such as switching devices coupling the differential transmission lines DP/DN to audio circuitry, USB application processor (AP), battery charger circuit, electrostatic discharge (ESD) devices, traces, flex connectors, and other circuitry.

There is a need in the art for improved equalizer circuits for use in high-speed data lines, such as in USB-C applications, that are exposed to parasitic capacitance from loading components.

SUMMARY

In one implementation, a wireless communication device includes an application processor; a pair of audio signal amplifiers; a charging integrated circuit; multiplexing circuitry configured to couple the application processor, the pair of audio signal amplifiers, and the charging integrated circuit to a set of wires; a data and charging plug coupled to the set of wires; and an equalizer coupled to a first wire of the set of wires, the equalizer including a first capacitor coupled between a first output of a gain element and a first input of the gain element, the equalizer further including a second capacitor and a first resistor coupled in parallel with the first capacitor.

In another implementation, a method includes receiving a differential data signal on differential data transmission lines, the differential data transmission lines being coupled to an application processor and multiplexing circuitry; equalizing the differential data signal, including applying a first portion of the differential data signal to an equalizer circuit, where the equalizer circuit includes a first capacitor coupled between a first output of a gain element and a first input of the gain element, the equalizer circuit further including a second capacitor and a first resistor coupled in parallel with the first capacitor, where the multiplexing circuitry is disposed between the application processor and the equalizer circuit; where equalizing the differential data signal further includes applying a second portion of the differential data signal to the equalizer circuit, where the equalizer circuit includes third capacitor coupled between a second output of the gain element and a second input of the gain element, the equalizer circuit further including a fourth capacitor and a second resistor coupled in parallel with the fourth capacitor; and processing the differential data signal at the application processor.

In another implementation, a wireless communication device includes means for running an operating system; means for amplifying analog audio signals; means for managing power from a battery of the wireless communication device; means for coupling the means for running the operating system, the means for amplifying analog audio signals, and the means for managing power to a set of wires; a data and charging plug coupled to the set of wires; and means for equalizing a differential data signal on the set of wires, where the means for equalizing may include an equalizer circuit having a transfer function with at least one second-order Laplace transform term.

In yet another implementation, a wireless communication device includes an application processor; a pair of audio signal amplifiers; a coder decoder (codec) chip having multiplexing circuitry configured to couple the application processor and the pair of audio signal amplifiers to a set of wires; a plug coupled to the set of wires; and an equalizer coupled to a first wire of the set of wires, the equalizer including a first loop having a first capacitor coupled between a first output of an amplifier and a first input of the amplifier, the equalizer further including a second loop having a second capacitor and a first resistor coupled between the first output of the amplifier and the first input of the amplifier.

These and additional advantages may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
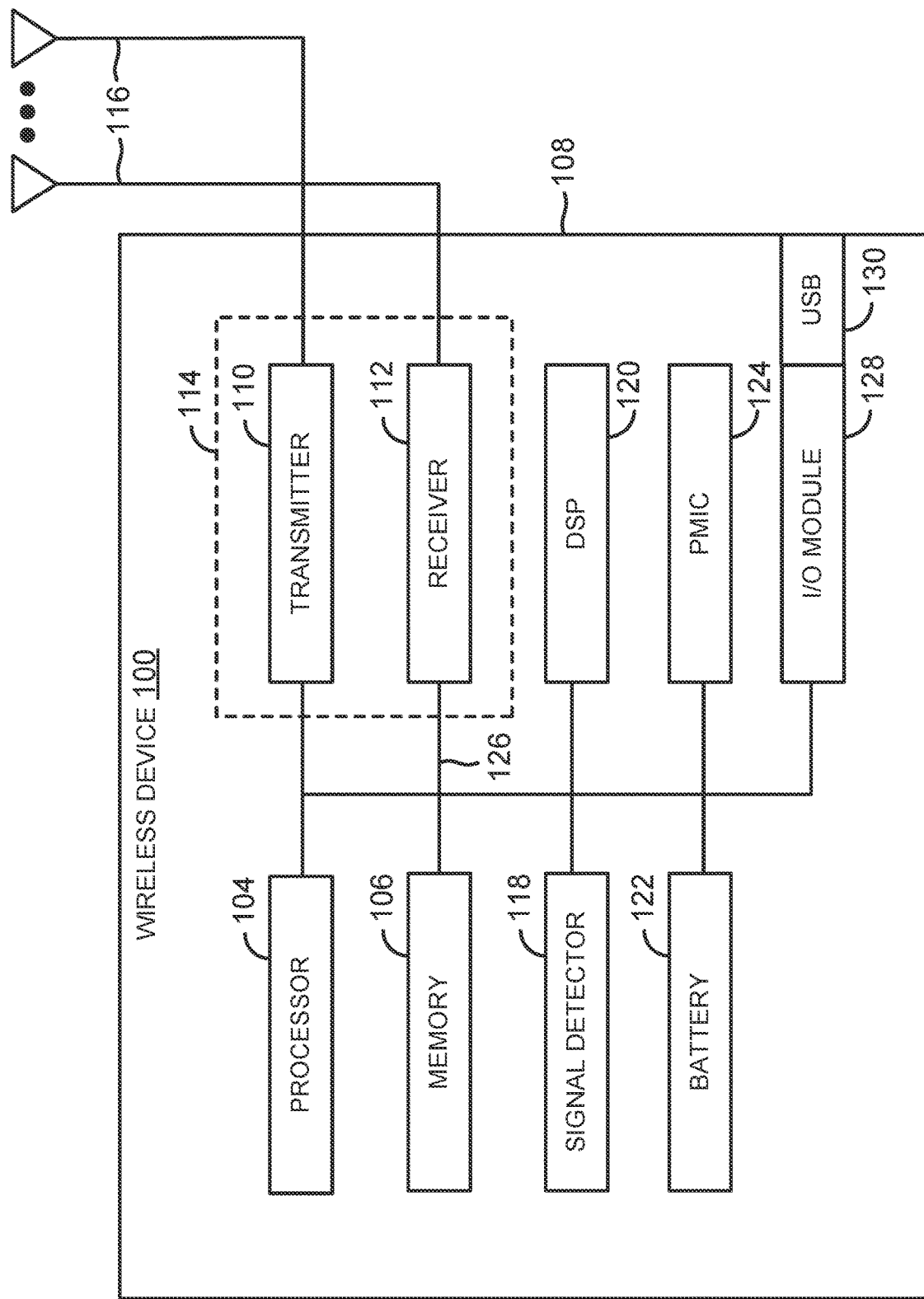
FIG. 1 illustrates a block diagram of an example wireless device that includes an equalizer, according to one implementation.

In one example, a wireless device includes a Universal Serial Bus (USB) Type-C (USB-C) receptacle that is used for multiple purposes, such as charging, transmitting high-speed data and/or analog audio signals, etc. For instance, the device may omit a 3.5 mm audio jack in favor of using a USB-C receptacle for physical attachment of a headset or earbuds. An advantage of such devices is that they may use a single receptacle for USB-C and audio, thereby saving area inside the housing of the device.

A disadvantage of using a USB-C receptacle for analog audio is that the resulting structure may have a more complex architecture with a variety of different components that add parasitic capacitance. For instance, flex connectors, traces, electrostatic discharge (ESD) circuits, multiplexing circuits, and the like may add parasitic capacitance on the line that is used for both USB-C data (e.g., high-speed data) and analog audio. The parasitic capacitance may be large enough to degrade bandwidth of the high-speed data lines.

One solution to handle the parasitic capacitance on the high-speed data lines includes using an equalizer circuit that applies a negative capacitance to cancel the unwanted capacitance and boost the bandwidth. However, as more components are added to the architecture, the parasitic capacitance gets larger, and the negative capacitance applied by the equalizer may also get larger. As a result, the equalizer itself may have an unacceptably large power use due to its high frequency gain and large internal capacitance.

Various implementations are proposed to include a second-order equalizer, used in conjunction with a resistor in series with at least some of the parasitic capacitance, to provide bandwidth improvement on the high-speed data lines.

In one example, a wireless communication device includes an application processor, a pair of audio signal amplifiers, and a charging integrated circuit (IC) coupled to a set of wires by multiplexing circuitry. A data and charging plug is coupled to the set of wires and to the multiplexing circuitry.

An equalizer is coupled to the first set of wires. The equalizer may include a gain element (e.g., an operational amplifier or op amp) and a first capacitor coupled between a first output of the gain element and a first input of the gain element. The equalizer may further include a second capacitor and a first resistor coupled in parallel with the first capacitor. The gain element may include any appropriate circuit to provide or modify gain of a signal. The gain element and the first capacitor may be thought of as a first loop, and the second capacitor and the first resistor may be thought of as a second loop. The high-speed data lines may further include a resistor in series with at least some parasitic capacitance components. The first loop, the second loop, the parasitic capacitance, and the resistor collectively result in a transfer function having a second-order Laplace transform component. The equalizer may eliminate or at least reduce distortion caused by the parasitic capacitance.

Some implementations may include methods of using the equalizer circuit. For instance, an example method may include receiving a signal, either single-ended or differential, equalizing the data signal, and then processing the signal in an application processor.

An advantage of some implementations is better performance. Specifically, reducing the distortion caused by the parasitic capacitance may allow for higher bandwidth of the high-speed data lines, which may lead to higher data transfer rates and greater user satisfaction. Another advantage may include reduced power usage. For instance, the resistor in series with at least some parasitic capacitance components may be used to isolate the parasitic capacitance at high frequencies, and with the parasitic capacitance being isolated, the gain element design can be relaxed compared to an alternate implementation without the resistor. Relaxation of the gain element design may result in less energy use by the gain element and, thus, increased battery life, which is particularly advantageous for portable devices, like wireless communication devices.

FIG. 1 illustrates an example device 100 in which aspects of the present disclosure may be implemented. The device 100 may be a battery-operated device such as a cellular phone, a handheld device, a wireless device, a laptop computer, a tablet, a smartphone, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as direct current (DC)-to-DC conversion, battery charging, power-source selection, voltage scaling, power sequencing, etc. In certain aspects, the PMIC 124 may include a battery charging circuit (e.g., a master-slave battery charging circuit) or other switched-mode power supply. The various components of the device 100 may be coupled together by a bus system 126, which may include a power bus, a control signal bus, and/or a status signal bus in addition to a data bus.

For certain aspects, the device 100 may have an input/output (I/O) module 128 for receiving and/or outputting data and/or power. In certain aspects, the I/O module 128 may include a connector 130, such as a USB Type-A (USB-A) receptacle or a USB-C receptacle. The pins of the connector 130 may be routed to the processor 104 and/or the PMIC 124 via signal lines of the bus system 126 and/or the I/O module 128, at least some of which may include an overvoltage protection circuit, as further described herein. Also, as described herein, the I/O module 128 may include a coder decoder (codec) chip, the codec chip including an audio signal path and drivers, among other hardware components, to facilitate audio through the connector 130.

Figure 2:
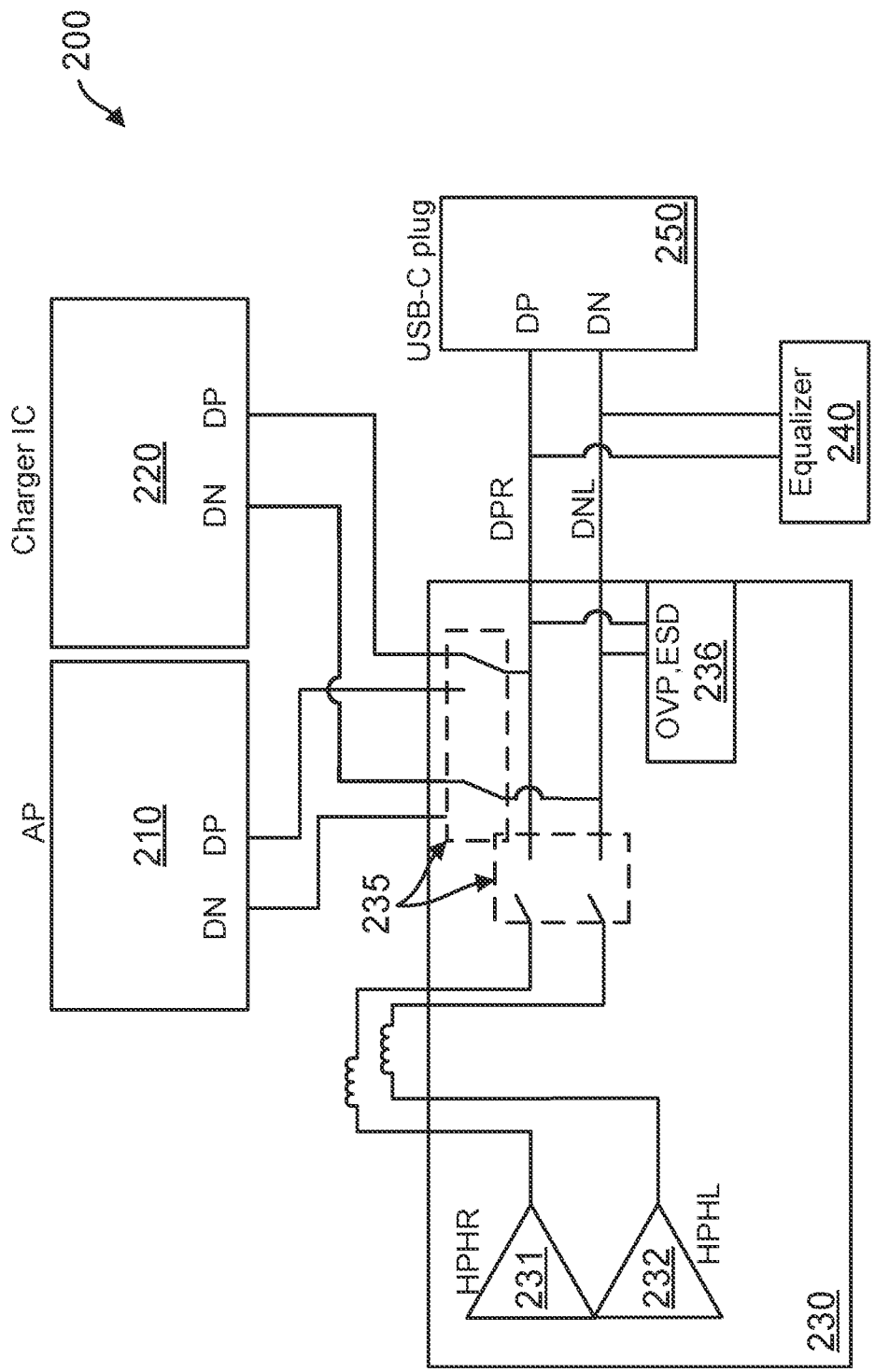
FIG. 2 illustrates an example architecture for multiplexing audio signals, high-speed data signals, and charging in a device such as the device of FIG. 1, according to one implementation.

FIG. 2 is an illustration of example hardware architecture 200, which provides more detail as to how some portions of device 100 may be implemented. For instance, architecture 200 includes application processor 210, which may include some or all of the functionality of processor 104 and DSP 120. In some examples, the application processor 210 may be a system on chip (SOC), which includes multiple processor cores, a digital signal processor (DSP), memory, and the like. For instance, one or more of the processor cores may run an operating system having a kernel that provides functionality for, e.g., controlling the multiplexing circuitry 235. The architecture 200 also includes the charger integrated circuit 220, which may include some or all of the functionality of PMIC 124.

Codec chip 230 may provide some or all of the functionality of I/O module 128, and also may include connector 130 to physically interface with plug 250. In this example, plug 250 is a USB-C plug, though the scope of implementations may include any appropriate plug, whether conforming to a standard or otherwise. The codec chip 230 interfaces with both an audio signal path and USB data path. For instance, codec chip 230 receives high-speed data on the DN and DP data lines from the USB-C plug 250. The codec chip 230 may then route that high-speed data to the application processor 210.

Additionally, the codec chip includes audio signal amplifiers 231, 232 for the left channel and right channel, respectively. Analog audio signals may be output to the USB-C plug 250 for use by, e.g., a wired headphone. Of note as well, the USB-C plug 250 may be used for charging so that DC power may be provided from the USB-C plug 250 to the charger IC 220.

To facilitate the shared connections, codec chip 230 includes multiplexing circuitry 235, which in FIG. 2 is illustrated as multiple switches. For instance, when audio signals are being transmitted from the audio signal amplifiers 231, 232 to the USB-C plug 250, switches may be turned on to create an electrical path from the audio signal amplifiers 231, 232 to the USB-C plug 250, whereas other switches may be turned off to isolate the application processor 210 from the audio signal path and to isolate the charger IC 220 from the audio signal path as well. Similarly, when the application processor 210 is transmitting and receiving digital data over the DP and DN pins with the USB-C plug 250, the charger IC 220 and the audio signal amplifiers 231, 232 may be isolated from the USB-C plug by the multiplexing circuitry 235. Also, when the charger IC 220 is receiving DC power over the DN and DP pins of the USB-C plug 250, the multiplexing circuitry 235 may create an electrical connection from the charger IC 220 to the USB-C plug 250 while isolating the application processor 210 and the audio signal amplifiers 231, 232 from the DC charging power. The multiplexing circuitry 235 may be controlled, e.g., by the application processor 210 or some other appropriate hardware or software logic within the architecture 200.

Codec chip 230 also includes overvoltage protection and electrostatic discharge circuit 236 (hereinafter, electrostatic discharge, or ESD, circuit 236), which monitors the signal levels on the lines DPR and DNL and may activate voltage suppression for positive or negative surges.

The architecture 200 further includes equalizer 240. Equalizer 240 is coupled to the lines DPR and DNL to equalize the high-speed data signals that traverse those lines. In some implementations, equalizer 240 may be integrated in the codec chip 230. In other implementations, equalizer 240 may be disposed outside the codec chip 230. In any event, the equalizer 240 is placed between the USB-C plug 250 and the multiplexer circuitry 235. As explained in more detail below the equalizer 240 applies a transfer function to the signals on the lines DPR and DNL to reduce the effects of the parasitic capacitance on those lines. For instance, in the architecture of FIG. 2, the parasitic capacitance may be primarily attributable to the multiplexing circuitry 235, though other sources, e.g., flex connectors, traces, ESD circuit 236, and the like may contribute parasitic capacitance as well.

Figure 3:
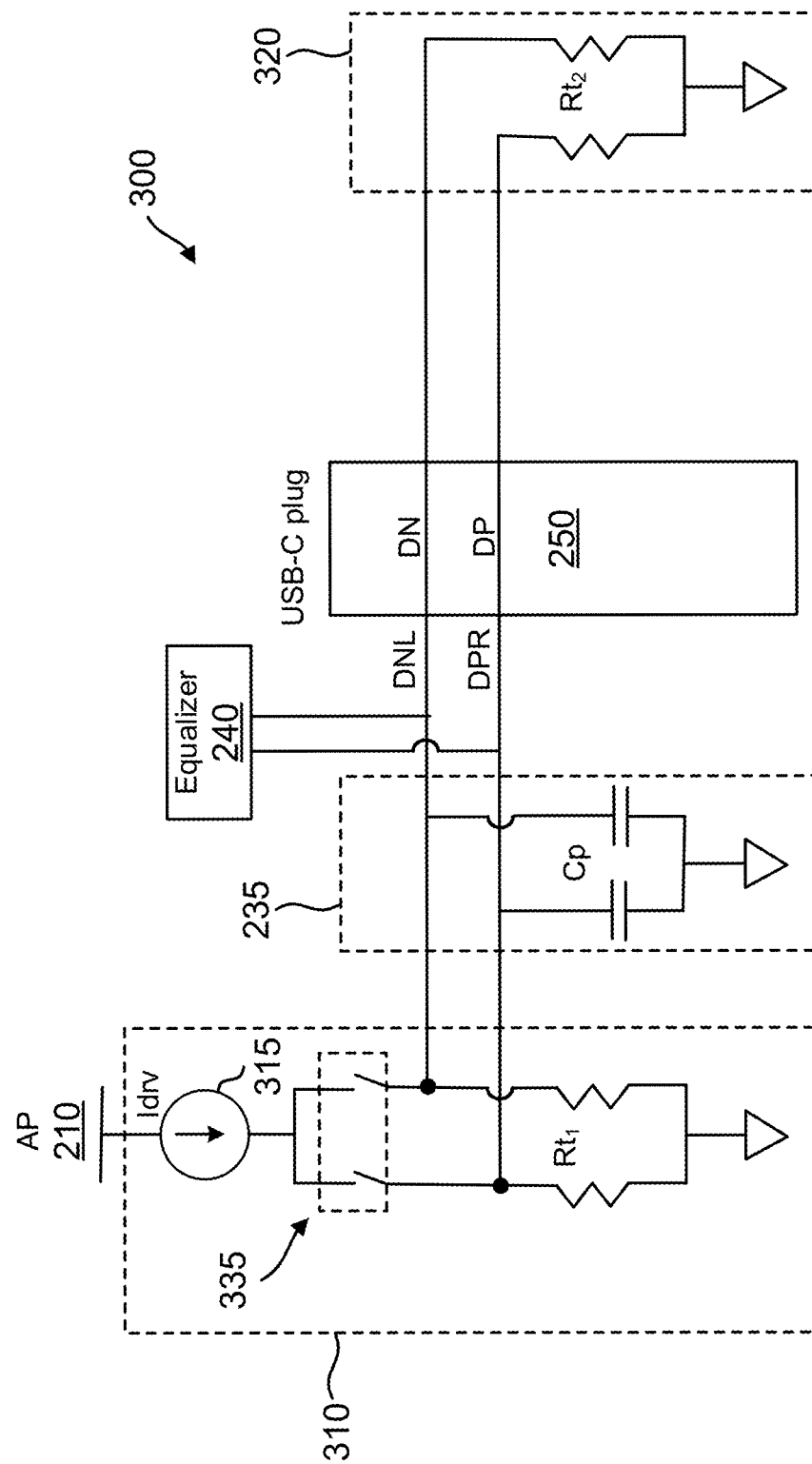
FIG. 3 illustrates an example transmission line schematic, associated with the implementation of FIG. 2, according to one implementation.

FIG. 3 illustrates a schematic diagram of an example Universal Serial Bus (USB) data transmission system 300 in accordance with another aspect of the disclosure. The USB data transmission system 300 may represent a simplified model for the transmission of USB differential data from a USB application processor 210 of a host device to a client device connected to a USB-C plug 250.

In particular, the USB data transmission system 300 includes a USB differential data signal driver 310, a multiplexing circuitry 235 having parasitic capacitance Cp as discussed above, a USB-C host connector (plug) 250, and a client device 320 connected to the USB-C plug 250.

The USB differential data signal driver 310 includes a current source 315, switches 335, and a terminating resistance Rt1 between the current source Idrv and the lower voltage rail (e.g., ground). The switches 335 are configured to receive an input USB differential data signal (not shown), which may be generated internally within the USB application processor 210. The USB differential data signal driver 310 is configured to generate an output USB differential data signal on the lines DNL and DPR.

The multiplexing circuitry 235 is shown including the parasitic capacitance Cp of the components coupled to the USB differential transmission lines DPR/DNL. The capacitance Cp is coupled between the USB differential transmission lines DPR/DNL and the lower voltage rail (e.g., ground). The USB differential transmission lines DPR/DNL are electrically coupled to DP/DN contacts of the USB-C plug 250. The client device 320, being connected to the USB-C plug 250, is electrically coupled to the DP/DN contacts of the USB-C plug 250, as represented by the client load resistance Rt2 being coupled between the DP/DN contacts and the lower voltage rail (e.g., ground).

Put another way, the data transmission system 300 of FIG. 3 illustrates that the high-speed data transmission lines DPR and DNL of FIG. 2 act as differential transmission lines at the data transmission frequencies associated with the application processor 210. Various components, primarily the multiplexing circuitry 235, add parasitic capacitance Cp to the data transmission lines, and that parasitic capacitance may lead to distortion and loss of bandwidth on the high-speed data transmission lines. Implementations described herein add the equalizer 240 to cancel or at least ameliorate the effects of the parasitic capacitance.

Figure 4:
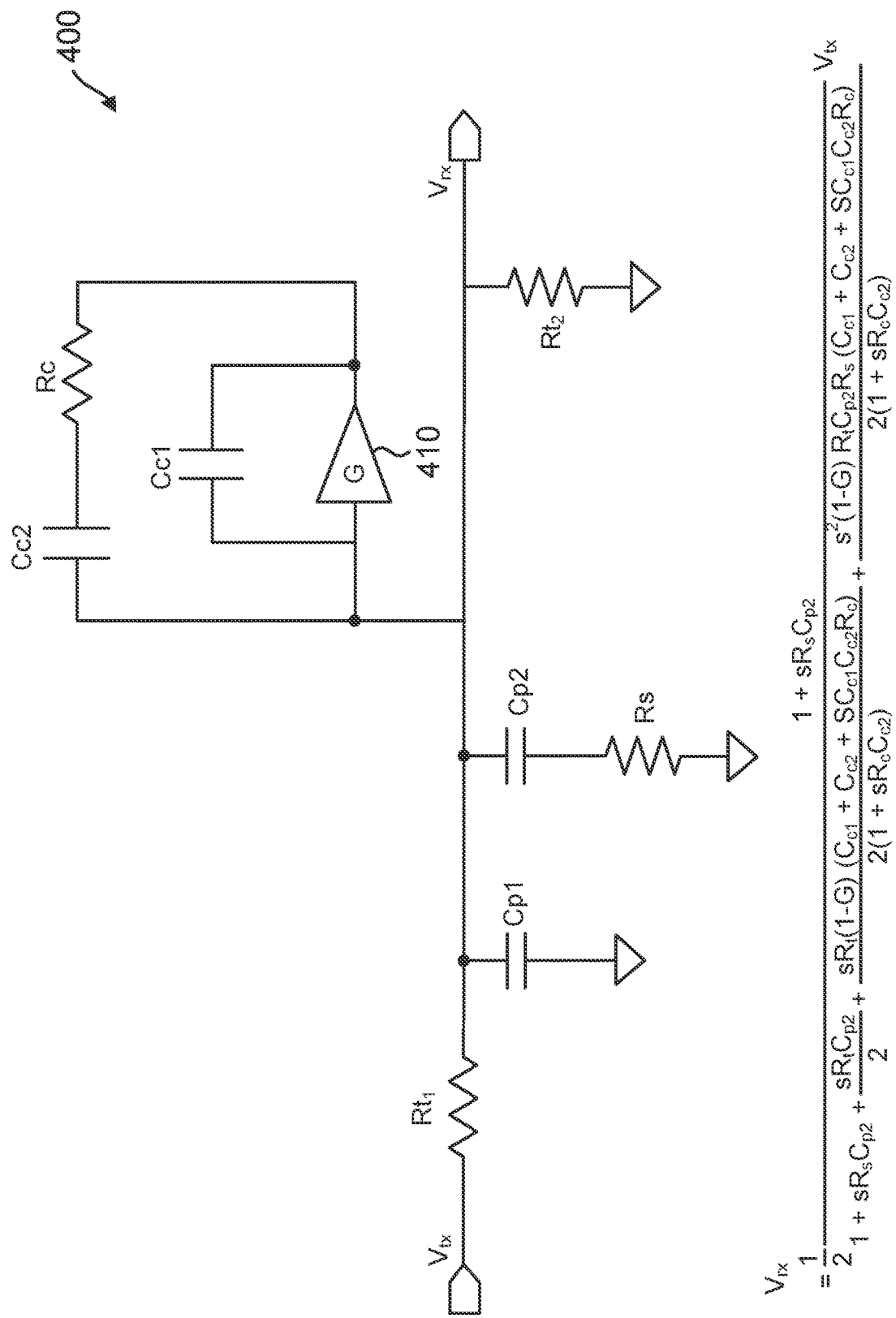
FIG. 4 illustrates an example transmission line architecture having equalization circuitry, according to one implementation.

FIG. 4 is an illustration of an example transmission line architecture 400 having equalization circuitry, according to one implementation of the present disclosure. FIG. 4 is offered to show a single-ended implementation, whereas FIG. 5 (explained in more detail below) is offered to show a differential implementation. The concepts of FIGS. 4 and 5 may be applied to the equalizer 240 of FIG. 2.

The transmission line architecture 400 has a termination resistance Rt1 and a load resistance Rt2. An input voltage is represented as Vtx, and an output voltage is represented as Vrx. The parasitic capacitance, which corresponds to Cp of FIG. 3, is divided into Cp1 and Cp2. Cp1 represents components of the parasitic capacitance that may not be amenable to the addition of a series resistor. By contrast, Cp2 represents components of the parasitic resistance that are amenable to the addition of the series resistor Rs. The purpose of the series resistor Rs is to isolate the parasitic capacitance Cp2 at high frequencies. However, without the equalization circuitry, the series resistor Rs would be expected to create a pole-zero pair that would attenuate the high-speed data signal at mid-frequencies.

The implementation of FIG. 4 includes equalization circuitry to provide a more appropriate transfer function that does not cause substantial attenuation at frequencies that are expected to be used during normal operation. The equalization circuitry includes gain element 410, which may be implemented as a transistor, an operational amplifier, or other appropriate device. Equalization circuitry also includes a first loop having compensation capacitor Cc1 coupled to the input of the gain element 410 and to the output of the gain element 410. The equalization circuitry further includes a second loop having compensation capacitor Cc2 coupled to the input of the gain element 410, Cc2 being coupled to compensation resistor Rc, where compensation resistor Rc is coupled to the output of the gain element 410.

Both the first loop and the second loop are arranged so that the gain element 410 has positive gain. For instance, both the first loop and the second loop may couple the output of the gain element 410 to the inverting input of the gain element, and the noninverting input of the gain element 410 may be coupled to a reference voltage (not shown).

The transfer function of the transmission line architecture 400, including the compensation circuitry, is given by the equation relating Vrx and Vtx. For instance, the transfer function may be given by Equation (1):

$$V_{rx} = \frac{1}{2} \frac{1 + sR_s C_{p2}}{1 + sR_s C_{p2} + \frac{sR_t C_{p2}}{2} + \frac{sR_t(1-G)(C_{C1} + C_{c2} + SC_{c1}C_c 2R_c)}{2(1 + sR_c C_{c2})} + \frac{s^2(1-G)R_t C_{p2} R_s (C_{C1} + C_{c2} + SC_{c1} C_{c2} R_c)}{2(1 + sR_C C_{c2})}} V_{tx}$$

Equation (1) includes a function "s", which in this example represents a Laplace transform. Some of the terms in Equation (1) include "$s^2$", which indicates a second-order Laplace transform. For this reason, the equalizer circuitry of the architecture 400 may be referred to as a "second-order" equalizer.

Figure 6:
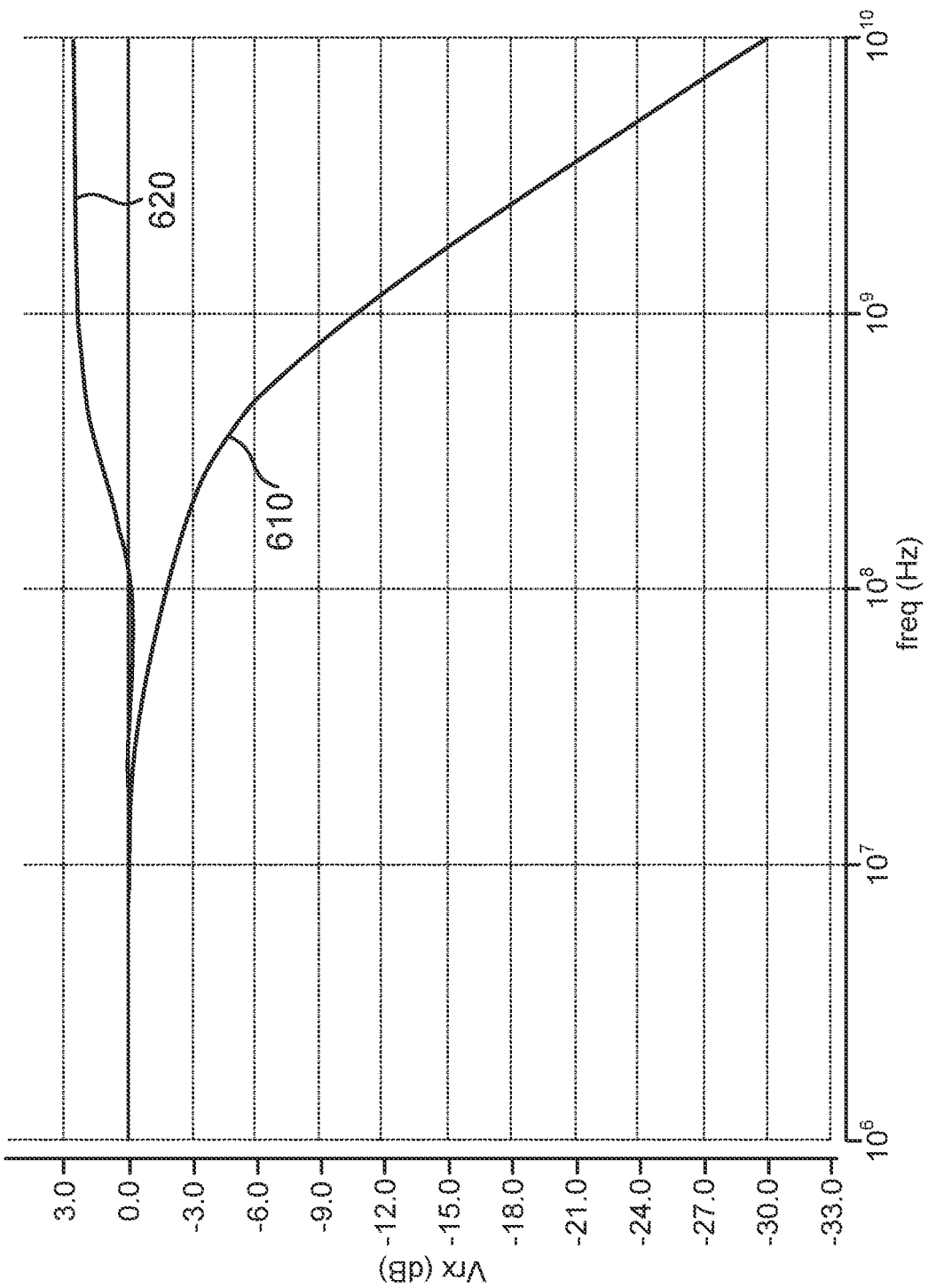
FIG. 6 illustrates an example gain curve associated with equalization circuitry, according to one implementation.

According to Equation (1), in a scenario in which Rt1=Rt2, Cc1=Cp1, Rc=Rs, Cp2=Cc2, and G=2, cancellation of the effects of the parasitic capacitance can be achieved. Furthermore, the values for Cc2 and Rc can be designed to provide a boost at a given frequency of interest. For instance, FIG. 6 shows two example curves 610, 620, according to one implementation. Curve 620 is an illustration of Vrx versus frequency for the implementation of FIG. 4. For curve 620, Rt1=Rt2=50 Ohms, Rs=Rc=200 Ohms, and Cp1=Cp1=Cp2=Cc2=10 pF. Curve 620 shows almost no attenuation between 1 MHz and 100 MHz and gain after 100 MHz, thereby demonstrating that the implementation of FIG. 4 may provide acceptable performance for applications that operate within that frequency range.

By contrast, curve 610 illustrates an implementation in which Rc and Cc2 are omitted (i.e., the second loop of the equalization circuitry is omitted). Furthermore, in curve 610, Cp1+Cp2=Cc1=20 pF. Curve 610 shows significant attenuation after about 100 MHz. A comparison of curves 610 and 620 indicates that the second loop shown in the equalizer circuitry of FIG. 4 provides acceptable performance over a larger frequency range. Additionally, if resistor Rs was omitted, the system would require a higher gain at gain element 410 to provide the same performance.

Of course, the values given above are for example only. It is understood that a given implementation may have values for resistances, capacitances, and gain set as appropriate for a given application. For instance, operating frequency range and desired gain may be factors to consider when designing a transmission line architecture.

Figure 5:
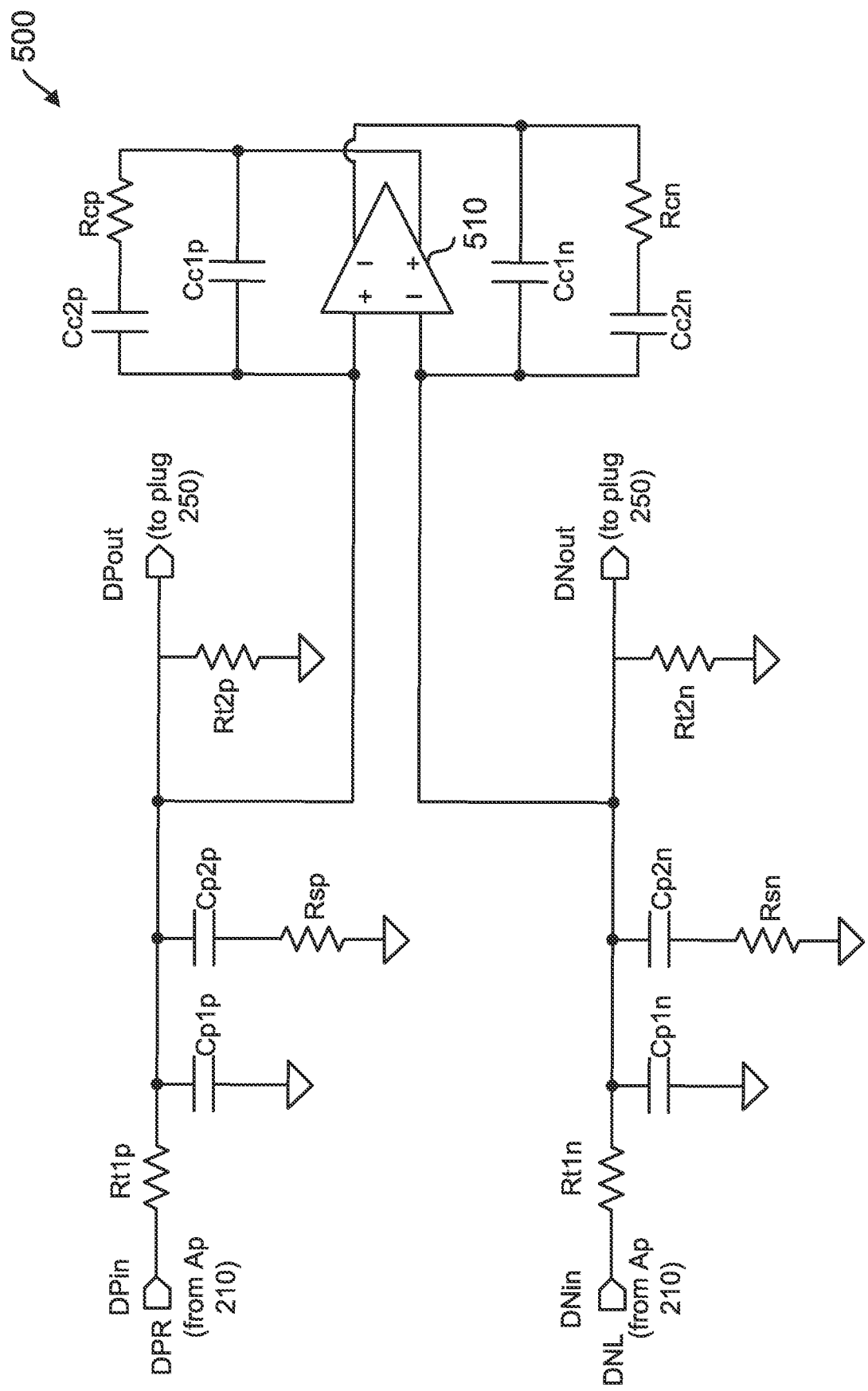
FIG. 5 illustrates an example transmission line architecture having equalization circuitry, according to one implementation.

FIG. 5 applies the concept of FIG. 4 to a differential signal implementation, according to one example. The transmission line architecture 500 of FIG. 5 has a first differential data line DPR and a second differential data line DNL, as described above with respect to FIGS. 2 and 3. With respect to the data line DPR, its input voltage is shown as DPin, and its output voltage is shown as DPout each of which corresponds to Vtx and Vrx of FIG. 4, respectively. Similarly, the data line DNL as an input voltage shown as DNin and an output voltage shown as DNout, which also correspond to Vtx and Vrx of FIG. 4, respectively.

The resistive and capacitive components discussed in FIG. 4 are included for the DPR data line and for the DNL data line. For instance, Rt1 and Rt2 of FIG. 4 correspond to Rt1p and Rt2p at the DPR data line and correspond to Rt1n and Rt2n at the DNL data line. In the example of FIG. 5, each of the resistive and capacitive components is given a notation "p" to indicate that it corresponds to the DPR data line or "n" to indicate that it corresponds to the DNL data line.

Also, in some implementations, resistive and capacitive components of data line DPR have a same value as the corresponding resistive and capacitive components of data line DNL. For instance, Rt1p=Rt1n, Cp1p=Cp1n, etc. However, the scope of implementations may include any appropriate value for a given resistive or capacitive component as appropriate for a particular application.

The gain element 510 is similar to the gain element 410, though the gain element 510 is adapted for use with a differential signal. For instance, a differential operational amplifier may be used as gain element 510, having both an inverting input and noninverting input as well as an inverting output and a noninverting output.

The equalization circuitry that serves the DPR data line is arranged in loops. The first loop includes Cc1p, and it is coupled to the noninverting input and the noninverting output of the gain element 510. The second loop includes Cc2p coupled to the noninverting input and Rcp coupled to the noninverting output.

Similarly, the equalization circuitry that serves the DNL data line is arranged in loops. The first loop includes Cc1n, and it is coupled to the inverting input and the inverting output of the gain element 510. The second loop includes Cc2n coupled to the inverting input and Rcn coupled to the inverting output.

With respect to the DPR data line, a relationship between DPout and DPin follows Equation (1), where DPout corresponds to Vrx and DPin corresponds to Vtx. Similarly, a relationship between DNout and DNin follows Equation (1), where DNout corresponds to Vrx and DNin corresponds to Vtx. Therefore, the performance of each of the data lines DPR and DNL in the implementation shown is expected to conform to curve 620 of FIG. 6, assuming similar values for the resistive and capacitive components and similar operating frequencies.

The transmission line architectures of FIGS. 4 and 5 may be used to transmit data bytes, where the data bytes are clocked. However, the operation of the equalization circuitry is not clocked in this example. In other words, the equalization circuitry is always on, at least during normal operation and when the DPR and DNL lines are used for carrying data bytes. Therefore, the power saving advantage of various implementations may be notable. As noted above, the second-order equalization circuitry may be used along with the series resistors Rs to reduce power use by the gain elements 410, 510 and to isolate at least some of the parasitic capacitance. The reduced power use by the gain elements 410, 510 may extend battery life and increase user satisfaction.

Furthermore, in the example of FIG. 2, the DPR data line corresponds to a right audio channel, and the DNL data line corresponds to a left audio channel. Thus, the implementation of FIG. 2 may provide stereo output for analog audio signals.

An example method for operating a transmission line with an equalizer circuit will now be discussed with reference to the flowchart shown in FIG. 7. The method 700 may be performed by a hardware architecture, such as is illustrated in FIG. 2, as it receives and transmits data on transmission lines. For instance, the hardware architecture may include one or more high-speed data transmission lines (e.g., DPR and DNL) coupled with multiplexing circuitry (e.g., multiplexing circuitry 235) and at least one application processor (e.g., application processor 210).

At action 710, the method includes receiving a differential data signal on differential data transmission lines. In this example, the differential data signals may be received at a frequency range that is susceptible to distortion from parasitic capacitance. In the examples above, the parasitic capacitance may be largely attributable to the multiplexing circuitry 235, and the frequency range may include digital data at or above about 50 MHz. Of course, the scope of implementations is not limited to any particular frequency range.

At action 720, the method includes equalizing the differential data signal. For instance, the differential data signal may be applied to an equalizer circuit. An example equalizer circuit is illustrated in FIG. 5. One component of the differential signal (e.g., the component corresponding to data line DPR) may be transformed by a first portion of the feedback circuit having two loops and a gain element. The other component of the differential signal (e.g., the component corresponding to data line DNL) may be transformed by a second portion of the feedback circuit having two loops and the same gain element. For instance, the gain element may have two inputs and two outputs, as illustrated in FIG. 5.

The equalizing at action 720 does not exclude that some effects of the parasitic capacitance may remain, despite the equalizing. For instance, some frequency ranges may not experience perfect cancellation of the effects of the parasitic capacitance, and perfect cancellation is not required in some instances. Rather, cancellation sufficient to render the differential signal usable by a given application may be appropriate.

At action 730, the method includes processing the differential data signal at an application processor. For instance, the application processor may transmit and receive high-speed data signals on the transmission lines, and the equalizer may help to provide an acceptable amount of gain throughout the frequency range of interest. The high-speed data signals may be communicated between the application processor (e.g., application processor 210) and a device coupled to the USB-C plug 250. Examples of devices that may be coupled to the USB-C plug 250 include other wireless devices, laptops, memory devices, and the like.

Figure 7:
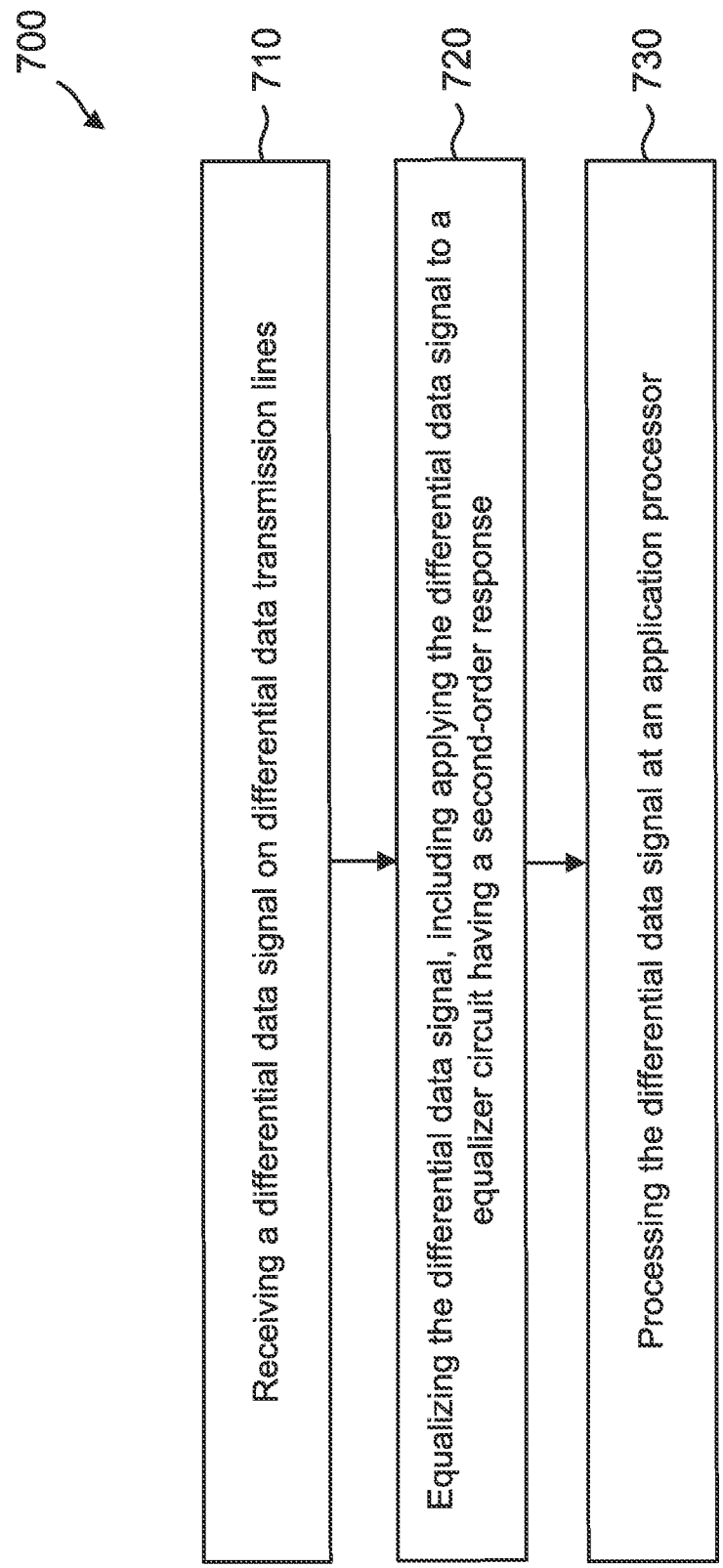
FIG. 7 illustrates a flowchart of an example method that may be performed by the example architecture of FIG. 2.

The scope of implementations is not limited to the series of actions described with respect to FIG. 7. Rather, operation of an equalizer may be thought of as an always-on process rather than a series of discrete actions, with the equalizer circuit being un-clocked and continuously shaping signals on the transmission lines.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A wireless communication device comprising:
    an application processor;
    a pair of audio signal amplifiers;
    a charging integrated circuit;
    multiplexing circuitry configured to couple the application processor, the pair of audio signal amplifiers, and the charging integrated circuit to a set of wires;
    a data and charging plug coupled to the set of wires; and
    an equalizer coupled to a first wire of the set of wires, the equalizer including a first capacitor coupled between a first output of a gain element and a first input of the gain element, the equalizer further including a second capacitor and a first resistor coupled in parallel with the first capacitor.
2. The wireless communication device of clause 1, wherein the equalizer is coupled to a second wire of the set of wires, the equalizer further including a third capacitor coupled between a second output of the gain element and a second input of the gain element, the equalizer further including a fourth capacitor and a second resistor coupled in parallel with the third capacitor.
3. The wireless communication device of clause 2, wherein the first wire of the set of wires is associated with a first differential polarity, and wherein the second wire of the set of wires is associated with a second differential polarity.
4. The wireless communication device of any of clauses 2-3, wherein the first input comprises a non-inverting input, and wherein the first output comprises a non-inverting output.
5. The wireless communication device of any of clauses 2-4, wherein the first capacitor is coupled to the gain element to provide a first feedback loop with gain, and wherein the third capacitor is coupled to the gain element to provide a second feedback loop with gain.
6. The wireless communication device of any of clauses 2-5, wherein the pair of audio signal amplifiers comprises a first channel amplifier and a second channel amplifier, wherein the first channel amplifier is coupled to the first wire of the set of wires, and wherein the second channel amplifier is coupled to the second wire of the set of wires.
7. The wireless communication device of any of clauses 2-6, further comprising:
    a third resistor coupled between the first wire of the set of wires and ground; and a fourth resistor coupled between the second wire of the set of wires and ground.
8. The wireless communication device of clause 7, wherein the first resistor and the third resistor have a same resistance value.
9. The wireless communication device of clause 7, wherein the first resistor and the third resistor have different resistance values.
10. The wireless communication device of any of clauses 1-9, wherein the data and charging plug comprises a universal serial bus (USB) plug.
11. The wireless communication device of any of clauses 1-10, further comprising: a codec chip that includes the set of wires, the pair of audio signal amplifiers, and the multiplexing circuitry.
12. A method comprising:
receiving a differential data signal on differential data transmission lines, the differential data transmission lines being coupled to an application processor and multiplexing circuitry;
equalizing the differential data signal, including applying a first portion of the differential data signal to an equalizer circuit, wherein the equalizer circuit includes a first capacitor coupled between a first output of a gain element and a first input of the gain element, the equalizer circuit further including a second capacitor and a first resistor coupled in parallel with the first capacitor, wherein the multiplexing circuitry is disposed between the application processor and the equalizer circuit;
wherein equalizing the differential data signal further includes applying a second portion of the differential data signal to the equalizer circuit, wherein the equalizer circuit includes third capacitor coupled between a second output of the gain element and a second input of the gain element, the equalizer circuit further including a fourth capacitor and a second resistor coupled in parallel with the fourth capacitor; and
processing the differential data signal at the application processor.
13. The method of clause 12, wherein the first portion of the differential data signal corresponds to a first differential data transmission line of the differential data transmission lines, and wherein the second portion of the differential data signal corresponds to a second differential data transmission line of the differential data transmission lines; and
wherein the first differential data transmission line comprises a third resistor coupled to ground, and wherein the second differential data transmission line comprises a fourth resistor coupled to ground.
14. The method of clause 13, wherein the first differential data transmission line corresponds to a first audio channel, and wherein the second differential data transmission line corresponds to a second audio channel.
15. The method of any of clauses 12-14, wherein the differential data signal comprises a universal serial bus (USB) data signal.
16. The method of any of clauses 12-15, further comprising: coupling, by the multiplexing circuitry, the differential data transmission lines to a universal serial bus (USB) plug.
17. A wireless communication device comprising:
means for running an operating system;
means for amplifying analog audio signals;
means for managing power from a battery of the wireless communication device;
means for coupling the means for running the operating system, the means for amplifying analog audio signals, and the means for managing power to a set of wires; a data and charging plug coupled to the set of wires; and
means for equalizing a differential data signal on the set of wires, wherein the means for equalizing comprises an equalizer circuit having a transfer function with at least one second-order Laplace transform term.
18. The wireless communication device of clause 17, wherein the means for equalizing comprises:
a first capacitor coupled between a first output of an amplifier and a first input of the amplifier, the means for equalizing further comprises a second capacitor and a first resistor coupled between the first output of the amplifier and the first input of the amplifier.
19. The wireless communication device of clause 18, wherein the means for equalizing further comprises:
a third capacitor coupled between a second output of the amplifier and a second input of the amplifier, the means for equalizing further comprises a fourth capacitor and a second resistor coupled in parallel with the third capacitor.
20. The wireless communication device of clause 19, wherein the first capacitor and the second capacitor are coupled to a first wire of the set of wires, and wherein the third capacitor and the fourth capacitor are coupled to a second wire of the set of wires.
21. The wireless communication device of clause 20, wherein the first wire corresponds to a first analog audio channel, and wherein the second wire corresponds to a second analog audio channel.
22. The wireless communication device of clause 20, wherein the first wire comprises a third resistor coupled to ground, and wherein the second wire comprises a fourth resistor coupled to ground, wherein the first resistor and the third resistor have a same resistance value, and wherein the second resistor and the fourth resistor have a same resistance value.
23. The wireless communication device of any of clauses 17-22, wherein the data and charging plug comprises a universal serial bus (USB) plug.
24. A wireless communication device comprising:
an application processor;
a pair of audio signal amplifiers;
a coder decoder (codec) chip having multiplexing circuitry configured to couple the application processor and the pair of audio signal amplifiers to a set of wires;
a plug coupled to the set of wires; and
an equalizer coupled to a first wire of the set of wires, the equalizer including a first loop having a first capacitor coupled between a first output of an amplifier and a first input of the amplifier, the equalizer further including a second loop having a second capacitor and a first resistor coupled between the first output of the amplifier and the first input of the amplifier.
25. The wireless communication device of clause 24, wherein the equalizer is coupled to a second wire of the set of wires, the equalizer further including a third capacitor coupled between a second output of the amplifier and a second input of the amplifier, the equalizer further including a fourth capacitor and a second resistor coupled in parallel with the third capacitor.

26. The wireless communication device of clause 25, wherein the first wire of the set of wires is associated with a first analog audio channel, and wherein the second wire of the set of wires is associated with a second analog audio channel.

27. The wireless communication device of clause 26, wherein the first wire of the set of wires is associated with a first differential polarity, and wherein the second wire of the set of wires is associated with a second differential polarity.

28. The wireless communication device of any of clauses 25-27, wherein the first capacitor is coupled to the amplifier to provide positive gain to a data signal on the first wire, and wherein the third capacitor is coupled to the amplifier to provide positive gain to the data signal on the first wire.

29. The wireless communication device of any of clauses 24-28, wherein the equalizer is disposed between the multiplexer circuitry and the plug.

30. The wireless communication device of any of clauses 24-29, wherein the plug comprises a universal serial bus (USB) plug.

What is claimed is:

1. A wireless communication device comprising:
an application processor;
a pair of audio signal amplifiers;
a charging integrated circuit;
multiplexing circuitry configured to couple the application processor, the pair of audio signal amplifiers, and the charging integrated circuit to a set of wires;
a data and charging plug coupled to the set of wires; and
an equalizer coupled to a first wire of the set of wires, the equalizer including a first capacitor coupled between a first output of a gain element and a first input of the gain element, the equalizer further including a second capacitor and a first resistor coupled in parallel with the first capacitor.

2. The wireless communication device of claim 1, wherein the equalizer is coupled to a second wire of the set of wires, the equalizer further including a third capacitor coupled between a second output of the gain element and a second input of the gain element, the equalizer further including a fourth capacitor and a second resistor coupled in parallel with the third capacitor.

3. The wireless communication device of claim 2, wherein the first wire of the set of wires is associated with a first differential polarity, and wherein the second wire of the set of wires is associated with a second differential polarity.

4. The wireless communication device of claim 2, wherein the first input comprises a non-inverting input, and wherein the first output comprises a non-inverting output.

5. The wireless communication device of claim 2, wherein the first capacitor is coupled to the gain element to provide a first feedback loop with gain, and wherein the third capacitor is coupled to the gain element to provide a second feedback loop with gain.

6. The wireless communication device of claim 2, wherein the pair of audio signal amplifiers comprises a first channel amplifier and a second channel amplifier, wherein the first channel amplifier is coupled to the first wire of the set of wires, and wherein the second channel amplifier is coupled to the second wire of the set of wires.

7. The wireless communication device of claim 2, further comprising:
a third resistor coupled between the first wire of the set of wires and ground; and
a fourth resistor coupled between the second wire of the set of wires and ground.

8. The wireless communication device of claim 7, wherein the first resistor and the third resistor have a same resistance value.

9. The wireless communication device of claim 7, wherein the first resistor and the third resistor have different resistance values.

10. The wireless communication device of claim 1, wherein the data and charging plug comprises a universal serial bus (USB) plug.

11. The wireless communication device of claim 1, further comprising:
a codec chip that includes the set of wires, the pair of audio signal amplifiers, and the multiplexing circuitry.

12. A method comprising:
receiving a differential data signal on differential data transmission lines, the differential data transmission lines being coupled to an application processor and multiplexing circuitry;
equalizing the differential data signal, including applying a first portion of the differential data signal to an equalizer circuit, wherein the equalizer circuit includes a first capacitor coupled between a first output of a gain element and a first input of the gain element, the equalizer circuit further including a second capacitor and a first resistor coupled in parallel with the first capacitor, wherein the multiplexing circuitry is disposed between the application processor and the equalizer circuit;
wherein equalizing the differential data signal further includes applying a second portion of the differential data signal to the equalizer circuit, wherein the equalizer circuit includes third capacitor coupled between a second output of the gain element and a second input of the gain element, the equalizer circuit further including a fourth capacitor and a second resistor coupled in parallel with the fourth capacitor; and
processing the differential data signal at the application processor.

13. The method of claim 12, wherein the first portion of the differential data signal corresponds to a first differential data transmission line of the differential data transmission lines, and wherein the second portion of the differential data signal corresponds to a second differential data transmission line of the differential data transmission lines; and
wherein the first differential data transmission line comprises a third resistor coupled to ground, and wherein the second differential data transmission line comprises a fourth resistor coupled to ground.

14. The method of claim 13, wherein the first differential data transmission line corresponds to a first audio channel, and wherein the second differential data transmission line corresponds to a second audio channel.

15. The method of claim 12, wherein the differential data signal comprises a universal serial bus (USB) data signal.

16. The method of claim 12, further comprising: coupling, by the multiplexing circuitry, the differential data transmission lines to a universal serial bus (USB) plug.

17. A wireless communication device comprising:
means for running an operating system;
means for amplifying analog audio signals;

means for managing power from a battery of the wireless communication device;
means for coupling the means for running the operating system, the means for amplifying analog audio signals, and the means for managing power to a set of wires;
a data and charging plug coupled to the set of wires; and
means for equalizing a differential data signal on the set of wires, wherein the means for equalizing comprises an equalizer circuit having a transfer function with at least one second-order Laplace transform term.

18. The wireless communication device of claim 17, wherein the means for equalizing comprises:
a first capacitor coupled between a first output of an amplifier and a first input of the amplifier, the means for equalizing further comprises a second capacitor and a first resistor coupled between the first output of the amplifier and the first input of the amplifier.

19. The wireless communication device of claim 18, wherein the means for equalizing further comprises:
a third capacitor coupled between a second output of the amplifier and a second input of the amplifier, the means for equalizing further comprises a fourth capacitor and a second resistor coupled in parallel with the third capacitor.

20. The wireless communication device of claim 19, wherein the first capacitor and the second capacitor are coupled to a first wire of the set of wires, and wherein the third capacitor and the fourth capacitor are coupled to a second wire of the set of wires.

21. The wireless communication device of claim 20, wherein the first wire corresponds to a first analog audio channel, and wherein the second wire corresponds to a second analog audio channel.

22. The wireless communication device of claim 20, wherein the first wire comprises a third resistor coupled to ground, and wherein the second wire comprises a fourth resistor coupled to ground, wherein the first resistor and the third resistor have a same resistance value, and wherein the second resistor and the fourth resistor have a same resistance value.

23. The wireless communication device of claim 17, wherein the data and charging plug comprises a universal serial bus (USB) plug.

24. A wireless communication device comprising:
an application processor;
a pair of audio signal amplifiers;
a coder decoder (codec) chip having multiplexing circuitry configured to couple the application processor and the pair of audio signal amplifiers to a set of wires;
a plug coupled to the set of wires; and
an equalizer coupled to a first wire of the set of wires, the equalizer including a first loop having a first capacitor coupled between a first output of an amplifier and a first input of the amplifier, the equalizer further including a second loop having a second capacitor and a first resistor coupled between the first output of the amplifier and the first input of the amplifier.

25. The wireless communication device of claim 24, wherein the equalizer is coupled to a second wire of the set of wires, the equalizer further including a third capacitor coupled between a second output of the amplifier and a second input of the amplifier, the equalizer further including a fourth capacitor and a second resistor coupled in parallel with the third capacitor.

26. The wireless communication device of claim 25, wherein the first wire of the set of wires is associated with a first analog audio channel, and wherein the second wire of the set of wires is associated with a second analog audio channel.

27. The wireless communication device of claim 26, wherein the first wire of the set of wires is associated with a first differential polarity, and wherein the second wire of the set of wires is associated with a second differential polarity.

28. The wireless communication device of claim 25, wherein the first capacitor is coupled to the amplifier to provide positive gain to a data signal on the first wire, and wherein the third capacitor is coupled to the amplifier to provide positive gain to the data signal on the first wire.

29. The wireless communication device of claim 24, wherein the equalizer is disposed between the multiplexer circuitry and the plug.

30. The wireless communication device of claim 29, wherein the plug comprises a universal serial bus (USB) plug.

* * * * *